United States Patent [19]
Son

[11] Patent Number: 6,010,936
[45] Date of Patent: Jan. 4, 2000

[54] SEMICONDUCTOR DEVICE FABRICATION METHOD

[75] Inventor: Jeong-Hwan Son, Daejon, Rep. of Korea

[73] Assignee: LG Semicon Co., Ltd., Choongcheongbuk-do, Rep. of Korea

[21] Appl. No.: 08/979,172

[22] Filed: Nov. 26, 1997

[30] Foreign Application Priority Data

Nov. 27, 1996 [KR] Rep. of Korea .................... 96-58082

[51] Int. Cl.⁷ ................................................ H01L 21/336
[52] U.S. Cl. ........................................ 438/303; 438/142
[58] Field of Search ................................ 438/303, 301, 438/299, 197, 142, 577, 183; 430/5, 314, 322, 323, 324; 148/DIG. 161

[56] References Cited

U.S. PATENT DOCUMENTS 5,338,703  8/1994  Matsuoka ............................ 438/577
5,362,982  11/1994  Hirase et al. ........................ 257/408
5,824,439  8/1996  Lee ...................................... 430/5

Primary Examiner—Chandra Chaudhari
Assistant Examiner—Craig Thompson

[57] ABSTRACT

A semiconductor device fabrication method and resulting device in which a gate insulating film is formed on a semiconductor substrate, a gate electrode is formed on the gate insulating film, a gate cap is formed on the gate electrode, a heavy density impurity region is formed in the substrate and outside the gate electrode, first side walls are formed on sides of the gate electrode, the gate cap and the gate insulating film. The substrate outside the gate insulating film is etched down to a portion having a highest impurity density, and a light doping region surrounding the heavy impurity region is formed in the substrate. The method and resulting device prevents a hot carrier from being injected into a gate oxide film or a side wall, and reduces the generation of a junction current leakage and a short channel.

33 Claims, 4 Drawing Sheets

SEMICONDUCTOR DEVICE FABRICATION METHOD

BACKGROUND OF THE INVENTION

1. Field of the Invention

The present invention relates to a semiconductor device and fabrication method, and more particularly to a semiconductor device and fabrication method for preventing device characteristics from deteriorating due to a hot carrier and for decreasing junction leakage.

2. Description of the Prior Art

FIG. 1 illustrates a MOSFET semiconductor device produced using a conventional fabrication method. In the conventional fabrication method, gate oxide film 12, gate electrode 13 and nitride cap 14 are sequentially formed on semiconductor substrate 11. Lightly doped region 17 is formed in substrate 11 using an ion-implanting process, and nitride side walls 15 are formed on the sides of the gate electrode 13 and the nitride cap 14. A second ion-implanting process is used to form heavily doped region 16 in substrate 11. Nitride cap 14 and nitride side walls 15 may be formed using an oxide.

Lightly doped region 17 decreases an electric field, effectively reducing a hot carrier generating rate. However, hot carriers are still generated on the surface of substrate 11 and injected into gate oxide film 12 or side walls 15, causing a deterioration of semiconductor device characteristics.

Furthermore, while side walls 15 are formed via etching, an edge of the field oxide region 18 may experience a junction fault. Such a fault causes an increase in current leakage within heavily doped region 16, effectively increasing diffusion of lightly doped region 17 during activation of heavily doped region 16.

SUMMARY OF THE INVENTION

Accordingly, one of the objects of the present invention is to provide a semiconductor device fabrication method for separating a heavily doped region from the surface of a substrate. This separation helps to prevent hot carriers from being injected into a gate oxide film or a side wall of the semiconductor device, and to reduce the generation of a junction leakage current and a short channel effect.

To achieve this and other objects of the present invention, the semiconductor device fabrication method includes forming a gate insulating film on a semiconductor substrate, forming a gate electrode on the gate insulating film, forming a gate cap on the gate electrode, forming a heavily doped region in the substrate and below each side of the gate electrode, forming first side walls on sides of the gate electrode and the gate cap, etching the substrate to a portion thereof having a highest impurity density using the first side walls and the gate cap as a mask, and forming a lightly doped region surrounding the heavily doped region in the substrate.

Further scope of applicability of the present invention will become apparent from the detailed description given hereinafter. However, it should be understood that the detailed description and specific examples, wile indicating preferred embodiments of the invention, are given by way of example only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

With reference to the accompanying drawings, a semiconductor device and fabrication method according to preferred embodiments of the present invention will be described.

Figure 1:
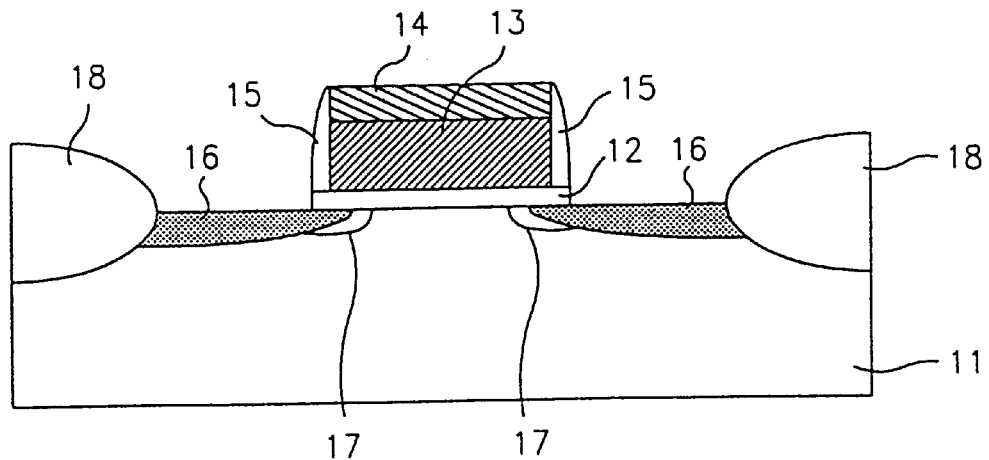
FIG. 1 is a cross-sectional view of a conventional semiconductor device.
Figure 2A:
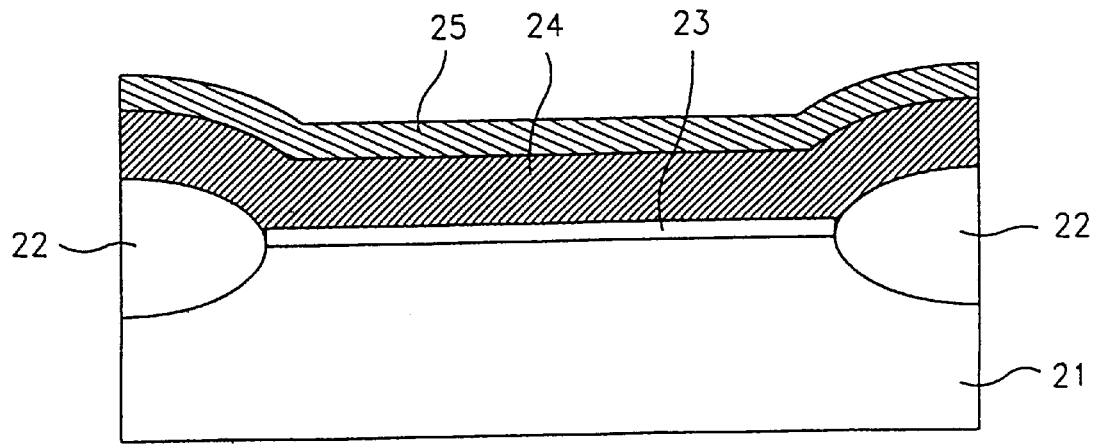
FIGS. 2A–2D are cross-sectional process views showing stages of a semiconductor device during a fabrication method according to a first embodiment of the present invention.

FIG. 2A shows a field oxide region 22 formed on semiconductor substrate 21. Field oxide region 22 is formed as an isolation structure using a local oxidation method. A gate oxide film 23 is formed on the substrate 21 with a thickness of about 20~100Å. A doped polysilicon layer 24, serving as a gate electrode, is formed on gate oxide film 23 with a thickness of about 1000~3000Å. An oxide film 25, serving as a gate cap, is deposited on doped olysilicon layer 24 with a thickness of about 500~2000Å. Oxide film 25 is deposited using a CVD (chemical vapor deposition) method.

Figure 2B:
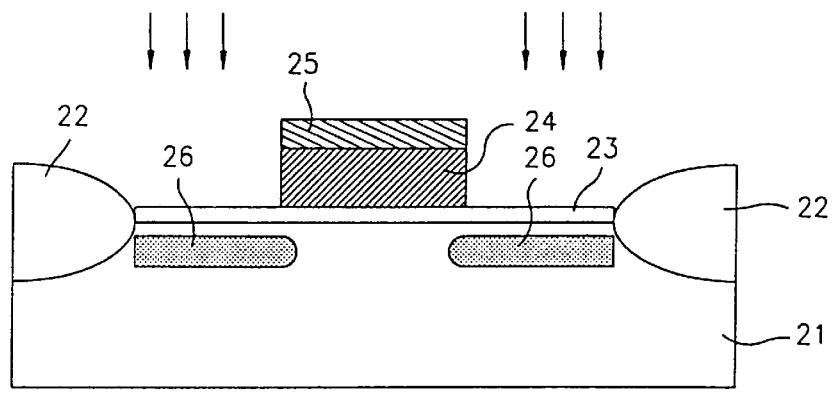

Referring to FIG. 2B, the oxide film 25 and the polysilicon film 24 are patterned and etched such that a portion of the gate oxide film 23 is exposed. A gate cap is formed using the oxide film 25 and a gate electrode 24 is formed using the polysilicon layer 24.

Using the gate cap 25 as a mask, ions are injected into substrate 21 to form heavily doped region 26 in substrate 21, below each side of gate electrode 24. For instance, when ions are implanted into the substrate 21 under the condition of 50~200keV, dose 2E15~5E15 cm$^{-2}$ and a tilt of 0~10 degree, a heavily doped n$^+$ impurity region 26 is formed deep in substrate 21.

Figure 2C:
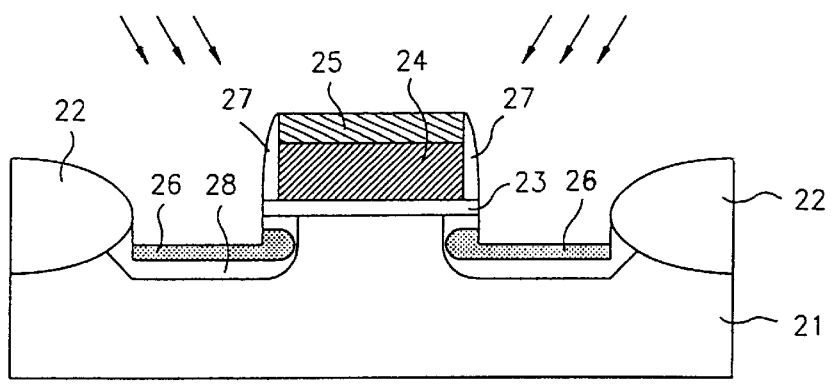

As shown in FIG. 2C, a nitride film is formed with a thickness of about 500~2000Å and subsequently etched to form first nitride side walls 27 on sides of gate electrode 24 and gate cap 25. Thereafter, a portion of the gate oxide film 23 and a portion of Lhe substrate 21 are etched using the first nitride sidewalls 27 and the gate cap 25 as a mask. Specifically, the substrate 21 is etched down to a portion having a highest impurity density in the heavily doped region 26. For instance, substrate 21 is etched down to a portion having a highest impurity density within heavily doped region 26. Next, As ions or P ions are implanted into the substrate 21 to form an n$^-$ lightly doped region 28 which surrounds the heavily doped region 26. As-ion implanting is preferably carried out at 50~200 keV, dose 2E15~5E15cm$^{-2}$ and a tilt of 0~10 deg. P-ion implanting is preferably performed at 30~100 keV, dose 1E14~5E14cm$^{-2}$ and a tilt of 0~10 degree.

Figure 2D:
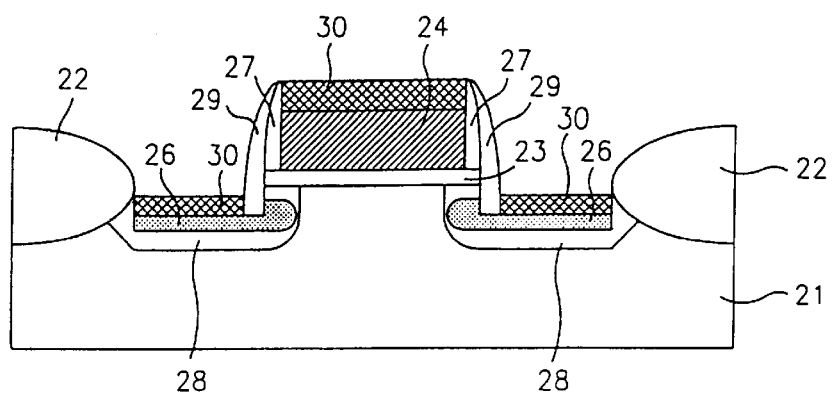

As shown in FIG. 2D, after the sequential steps shown in FIGS. 2A through 2C are performed, further fabrication steps can be carried out. For instance, second side walls 29 may be formed on the first side walls 27, on each side of the etched gate oxide film 23, and on each side of the etched substrate; the gate cap 25 may be removed; and a silicide film 30 may be formed on the gate electrode 24 and on the exposed surface of the substrate 21 having the heavily doped region 26 therein. The second side walls 29 are formed by selectively etching a nitride deposited with a thickness of about 500~2000Å. The silicide film 30 is formed by a rapid thermal annealing (RTA) after depositing a metal such as Ti and Co. The gate cap 25 is removed to enable more controlled formation of the silicide layer 30 which silicide layer 30 is formed only on the gate electrode 24 and on a portion of the exposed substrate 21 having the heavily doped region 26.

The chemicals and ions used in the above embodiment can be replaced by other chemicals and ions. For instance, an ionized $BF_2$ can be employed in place of an ionized As while forming the heavily doped region 26, and an ionized $BF_2$ and an ionized B can be replaced by an ionized As or an ionized P while forming the lightly doped region 28. Similarly, gate cap 25 may be formed of a nitride film in place of an oxide film, and the first and second side walls 27, 29 may be formed of an oxide film in place of a nitride film.

According to the above-described semiconductor device fabrication method according to the first embodiment of the present invention, the heavily doped region 26 is separated from a plane defined by the surface of the substrate 21 during formation of substrate 21, and is separated from the gate oxide film 23 and gate electrode 24. Consequently, carriers move in the direction of the substrate 21 from the edge of the gate electrode 24. The injection of hot carriers generated in a portion of the heavily doped region 26 that is separated from the surface of the substrate 21 into the gate oxide 23 and the side walls 27, 29 is therefore minimized.

FIGS. 3A–3D are cross-sectional views illustrating the semiconductor device formed using fabrication method according to a second embodiment of the present invention.

Figure 3A:
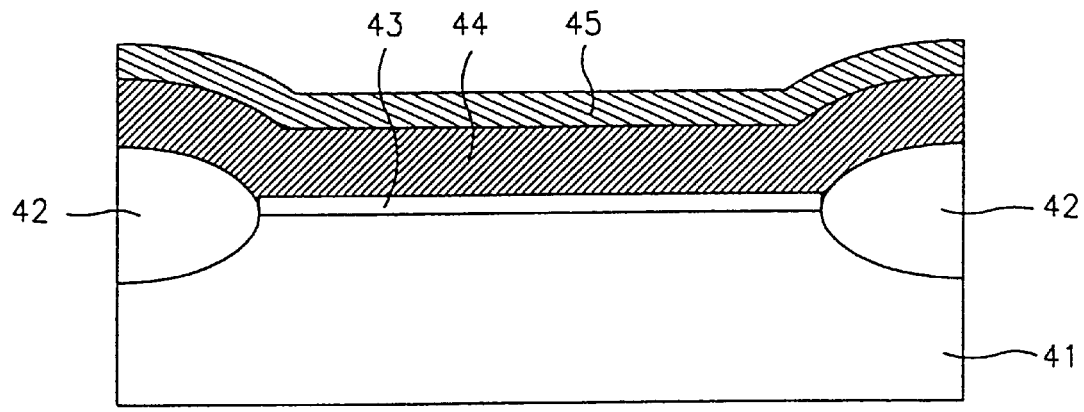
FIGS. 3A–3D are cross-sectional process views showing stages of a semiconductor device during a fabrication method according to a second embodiment of the present invention.

As shown in FIG. 3A, a field oxide region 42 is formed in and over a semiconductor substrate 41. Field oxide region 42 is formed as an isolation structure in accordance with a local oxidation method. A gate oxide film 43 is formed on the substrate 41 with a thickness of about 40~100Å. A doped polysilicon layer 44, serving as a gate electrode, is formed on gate oxide film 43 with a thickness of about 1000~3000Å. An oxide film 45, serving as a gate cap, is deposited on doped polysilicon layer 44 with a thickness of about 500~2000Å. Oxide film 45 is deposited using a CVD chemical vapor deposition) method.

Figure 3B:
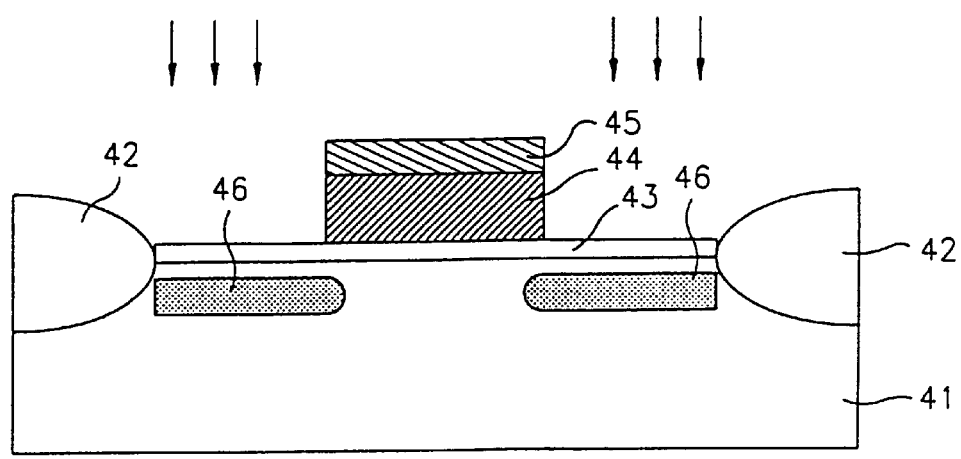

Referring to FIG. 3B, the oxide film 45 and the polysilicon layer 44 are patterned and etched such that a portion of the gate oxide film 43 is exposed. A gate cap 45 is formed using the oxide film 45 and a gate electrode 44 is formed using the polysilicon layer 44.

Using the gate cap 45 as a mask, ions are injected into substrate 41, to form heavily doped region 46 in substrate 41 below each side of gate electrode 44. For instance, when As ions are implanted into the substrate 41 under the condition of 50~200keV, dose $2E15~5E15cm^{-2}$ and a tilt of 0~10 degree, a heavily doped $n^+$ impurity region 46 is formed deep in substrate 41.

Figure 3C:
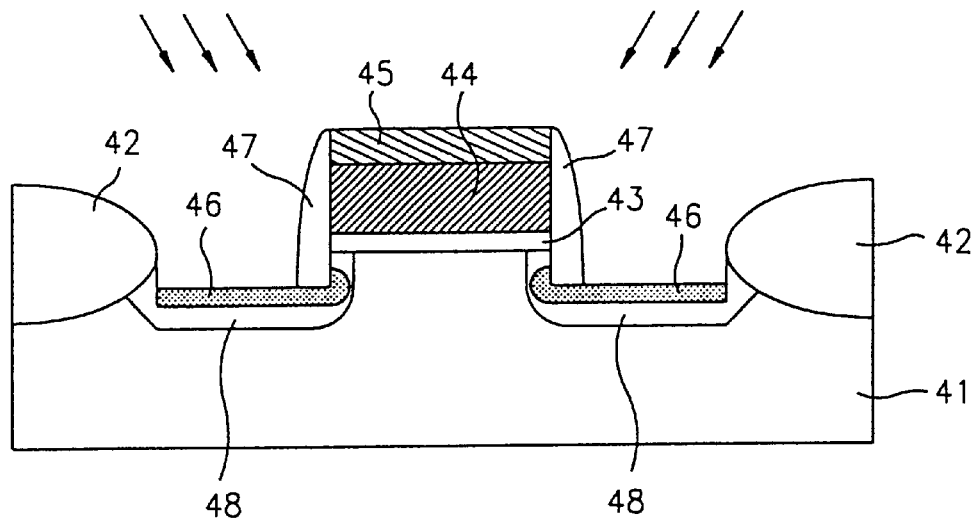

As shown in FIG. 3C, a portion of the substrate 41 located between the gate oxide film 43 and the field oxide region 42 is etched down to a portion having the highest impurity density in the heavily doped region 46. On the entire exposed surface of the resultant structure, there is formed a nitride film having thickness ranging from 500Å to 2000Å. The nitride film is selectively etched to form nitride side walls 47 on respective sides of the gate cap 45, the gate electrode 44, the gate oxide film 43 and the heavily doped region 46 of the inner walls in the substrate 41. Next, As ions or P ions are implanted into the substrate 41 to form an $n^-$lightly doped region 48 that surrounds the heavily doped region 46 in the substrate 21. As-ion implanting is preferably carried out at 50~200keV, dose $1E14~5E15cm^{-2}$ and a tilt of 0~10 deg. P-ion implanting is preferably performed at 30~10keV, dose $1E14~5E14cm^{-2}$ and a tilt of 0~10 deg.

Figure 3D:
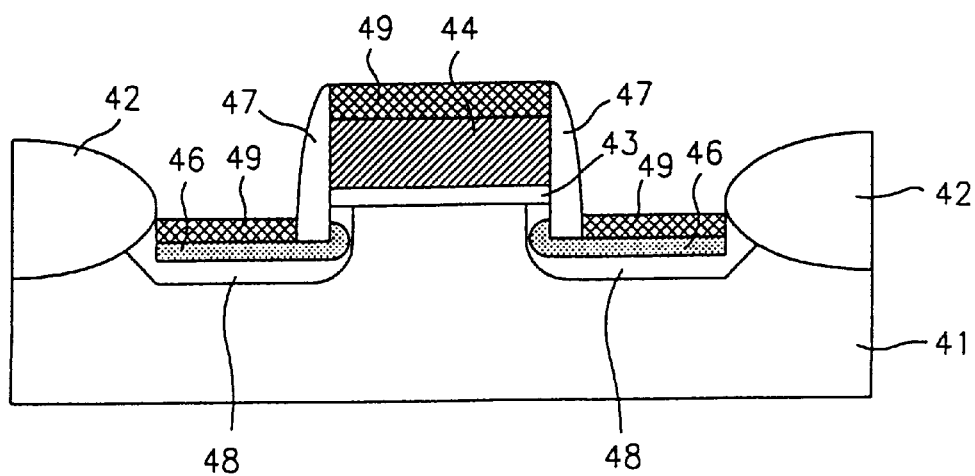

As shown in FIG. 3D, after the sequential steps shown in FIGS. 3A through 3C are performed, further fabrication steps can be carried out such as removing the gate cap 45 and forming a silicide film 49 in the etched portion of the substrate 41. The silicide film 49 is composed of a metal such as Ti and Co and is formed by a RTA method. The gate cap 45 is removed to enable more controlled formation of the silicide film 49. The silicide film 49 is formed only on the gate electrode 44 and on a portion of the substrate 41 having the heavily doped region 46.

The chemicals and ions used in the above embodiment can be replaced by other chemicals and ions. For instance, $BF_2$ ions can be employed in place of As ions while forming the heavily doped region 46, and an ionized $BF_2$ and an ionized B can be replaced by an ionized As while forming the lightly doped region 28 or an ionized P. Similarly, gate cap 45 may be formed of a nitride film instead of an oxide film, and the side walls 47 may be formed of oxide in place of nitride.

The semiconductor device fabrication method according to the second embodiment of the present invention decreases the steps of forming the first and second side walls as shown in FIG. 2D to a single step as shown in FIG. 3C.

As described above, the semiconductor device fabrication method according to the present invention prevents a device characteristic from degrading by hot carriers. Furthermore, because the lightly doped region 48 surrounds a large portion of the heavily doped region 46, a current leakage of the heavily doped region 48, which occurs at edges of the field oxide region 42, is minimized.

Further, because the heavily doped region 48 is formed prior to the lightly doped region 46, the diffusion of the lightly doped region 46 can be prevented during an activation of the heavily doped region 48, thereby decreasing a short channel effect.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded by the applicant as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer or alternative inventive concepts that are included in the contents of the application and could be defined by claims differing in scope from the following claims, which different claims may be adopted subsequently during prosecution, for example, for the purposes of a continuation or divisional application.

I claim:

1. A semiconductor device fabrication method, comprising:
   forming a gate electrode on a semiconductor substrate;
   forming a first doped region in the semiconductor substrate below each side of the gate electrode;
   forming first side walls on sides of the gate electrode; and
   etching the substrate using the first side walls as a mask.

2. The method recited by claim 1, further including:
   forming a gate cap above the gate electrode, the gate cap being used as a mask when etching the substrate in the etching step.

3. The method recited by claim 1, wherein the etching step includes etching the substrate to a depth that is below a plane defined by the surface of the substrate prior to etching.

4. The method recited by claim 2, further comprising:
   forming a gate insulating film on the semiconductor substrate;
   forming a conductive layer on the gate insulating film; and
   forming a gate cap film on the conductive layer,
   wherein the steps of forming the gate cap and the gate electrode include selectively etching the gate cap film and the conductive layer, and
   wherein the step of etching includes etching a portion of the gate insulating film adjacent to the first side walls.

5. The method recited by claim 1, further comprising:
   forming second side walls on the first side walls and on sides of the etched substrate.

6. The method recited by claim 5, wherein the first side walls and the second side walls are each formed of ions selected from at least one of an oxide and a nitride.

7. The method recited by claim 4, further comprising:
   forming second side walls on the first side walls and on sides of the etched gate insulating film and the etched substrate.

8. The method recited by claim 7, wherein the first side walls and the second side walls are each formed of ions selected from at least one of an oxide and a nitride.

9. The method recited by claim 1, further comprising:
   removing the gate cap after the etching step; and
   forming a silicide layer on the gate electrode and on the substrate.

10. The method recited by claim 1, further comprising:
    forming a second doped region surrounding the first doped region, an impurity density of the first region being different from an impurity density of the second region.

11. The method recited by claim 10, wherein the impurity density of the first region is larger than the impurity density of the second region.

12. The method recited by claim 10, wherein the first and second doped regions are formed by ion-implanting at least one of n-type impurities and p-type impurities.

13. The method recited by claim 10, wherein the first doped region is formed by ion-implanting at least one of As ions and ionized $BF_2$, with 50 keV to 2000 keV, a dose of $2E15cm^{-2}$ to $5E15cm^{-2}$, and a tilt of 0–10 degrees.

14. The method recited by claim 10, wherein the second doped region is formed by ion-implanting P ions, with 30 keV to 100keV, a dose of $1E14cm^{-2}$ to $5E14cm^{-2}$, and a tilt of 0–10 degrees.

15. The method recited by claim 10, wherein the second doped region is formed by ion-implanting at least one of As ions, B ions and ionized $BF_2$, with 30keV to 100 keV, a dose of $1E24cm^{-2}$ to $5E14cm^{-2}$, and a tilt of 0–10 degrees.

16. The method recited by claim 4, wherein the conductive layer is formed of polysilicon having a thickness ranging from 1000 angstroms to 3000 angstroms.

17. The method recited by claim 4, wherein the gate insulating film is formed of an oxide film having a thickness ranging from 40 angstroms to 100 angstroms.

18. The method recited by claim 4, wherein the gate cap film is formed of at least one of an oxide and a nitride, each having a thickness ranging from 500 angstroms to 2000 angstroms.

19. The method recited by claim 1, wherein the first side wall is also formed on sides of the gate cap, on sides of the gate electrode, and on a portion of the etched substrate.

20. The method recited by claim 19, further comprising:
    forming a gate insulating film on the semiconductor substrate, the gate electrode being formed on the gate insulating film,
    wherein the first side wall is also formed on sides of the gate insulating film.

21. The method recited by claim 19, further comprising:
    removing the gate cap after the etching step; and
    forming a silicide layer on the gate electrode and on the substrate.

22. The method recited by claim 19, further comprising:
    forming a second doped region surrounding the first doped region, an impurity density of the first region being different from an impurity density of the second region.

23. The method recited by claim 22, wherein the impurity density of the first region is larger than the impurity density of the second region.

24. The method recited by claim 22, wherein the first and second doped regions are formed by ion implanting at least one of n-type impurities and p-type impurities.

25. The method recited by claim 22, wherein the first doped region is formed by ion-implanting at least one of As ions and ionized $BF_2$, with 50 keV to 2000keV, a dose of $2E15cm^{-2}$ to $5E15cm^{-2}$, and a tilt of 0–10 degrees.

26. The method recited by claim 22, wherein the second doped region is formed by ion-implanting P ions, with 30 keV to 100keV, a dose of $1E14cm^{-2}$ to $5E14cm^{-2}$, and a tilt of 0–10 degrees.

27. The method recited by claim 22, wherein the second doped region is formed by ion-implanting at least one of As ions, B ions and ionized $BF_2$, with 30keV to 100keV, a dose of $1E14cm^{-2}$ to $5E14cm^{-2}$, and a tilt of 0–10 degrees.

28. The method recited by claim 19, wherein the first side walls are formed of ions selected from at least one of an oxide and a nitride.

29. The method recited by claim 20, wherein the gate insulating film is formed of an oxide film having a thickness ranging from 40 angstroms to 100 angstroms.

30. The method recited by claim 19, wherein the gate electrode is formed of polysilicon having a thickness ranging from 1000 angstroms to 3000 angstroms.

31. The method recited by claim 19, wherein the gate cap film is formed of at least one of an oxide and a nitride, each having a thickness ranging from 500 angstroms to 2000 angstroms.

32. The method recited by claim 1, wherein the first doped region is formed in the semiconductor substrate at a position that is separated from a plane that is defined by the surface of the substrate prior to etching.

33. The method recited by claim 11, wherein the first region is formed prior to the second region.

* * * * *